US010914627B2

(12) United States Patent
Nuttgens et al.

(10) Patent No.: US 10,914,627 B2
(45) Date of Patent: Feb. 9, 2021

(54) CONFIGURABLE LASER MONITOR PHOTODIODE IN OPTICAL MODULATION AMPLITUDE CONTROLLER

(71) Applicant: Semtech Corporation, Camarillo, CA (US)

(72) Inventors: Jonah Edward Nuttgens, Southampton (GB); James Stephen Mason, Hampshire (GB)

(73) Assignee: Semtech Corporation, Camarillo, CA (US)

(*) Notice: Subject to any disclaimer, the term of this patent is extended or adjusted under 35 U.S.C. 154(b) by 72 days.

(21) Appl. No.: 16/274,261

(22) Filed: Feb. 13, 2019

(65) Prior Publication Data
US 2020/0259311 A1 Aug. 13, 2020

(51) Int. Cl.
*G01J 1/42* (2006.01)
*G01J 1/44* (2006.01)
*H01L 31/02* (2006.01)
*H01L 31/147* (2006.01)
*H01S 5/068* (2006.01)
*H01S 5/042* (2006.01)

(52) U.S. Cl.
CPC ............ *G01J 1/4257* (2013.01); *G01J 1/44* (2013.01); *H01L 31/02019* (2013.01); *H01L 31/147* (2013.01); *H01S 5/06812* (2013.01); *H01S 5/0427* (2013.01)

(58) Field of Classification Search
CPC ............ H01S 5/06812; H01S 5/0427; H01L 31/02019; H01L 31/147; G01J 1/4257; G01J 1/44; H03F 3/082; H03F 3/08; H03F 3/217
See application file for complete search history.

(56) References Cited

U.S. PATENT DOCUMENTS

| 4,819,241 A | 4/1989 | Nagano |
| 5,276,671 A * | 1/1994 | Minami ................ G11B 7/126 250/205 |
| 8,548,336 B2 | 10/2013 | Nuttgens |
| (Continued) | | |

OTHER PUBLICATIONS

Bauwelinck, Johan et al., Current Mode Circuits for Fast and Accurate Optical Level Monitoring with Wide Dynamic Range, IEICE Transactions on Communications, Communications Society, vol. E87-B, No. 9, Sep. 1, 2004.

*Primary Examiner* — Jennifer D Bennett
(74) *Attorney, Agent, or Firm* — Robert D. Atkins; Patent Law Group: Atkins and Associates, P.C.

(57) ABSTRACT

A photodiode current comparison circuit has a first current source coupled to a circuit node configurable to operate in a first mode, a second current source coupled to the circuit node configurable to operate in a second mode opposite the first mode, and a third current source switchable to route a current to the circuit node in response to a data signal using a transistor coupled between the circuit node and the third current source. A photodiode is coupled to the circuit node. In a first configuration, an anode of the photodiode is coupled to the circuit node and a cathode of the photodiode is coupled to a power supply terminal. In a second configuration, a cathode of the photodiode is coupled to the circuit node and an anode of the photodiode is coupled to a power supply terminal. An amplifier provides an error signal of the photodiode.

24 Claims, 5 Drawing Sheets

(56) References Cited

U.S. PATENT DOCUMENTS

| | | | |
|---|---|---|---|
| 9,300,405 B2 | 3/2016 | Nuttgens | |
| 2008/0266907 A1* | 10/2008 | Kim | H02M 1/36 363/21.1 |
| 2014/0186056 A1* | 7/2014 | Nuttgens | H04B 10/564 398/197 |
| 2018/0294886 A1* | 10/2018 | Coue | H04B 10/54 |

* cited by examiner

CONFIGURABLE LASER MONITOR PHOTODIODE IN OPTICAL MODULATION AMPLITUDE CONTROLLER

FIELD OF THE INVENTION

The present invention relates in general to optical data transmission and, more particularly, to a configurable laser monitor photodiode in an optical modulation amplitude controller circuit.

BACKGROUND OF THE INVENTION

Optical communication involves the transmission of information from one place to another by sending pulses of light, typically through an optical fiber cable. A laser diode is commonly used to transmit data in digital form over a telecommunications network. The light forms a carrier wave that is modulated to carry information. Optical transmission involves generating an optical signal independent of changes in the laser diode's operating environmental conditions or aging factors over time. Optical communications are known for low-loss and high data-carrying capacity. However, the quality of optical signal must be controlled in order to achieve the advantages of the optical communication system.

A laser driver circuit is used to control the transmission of light from the laser diode. Optical modulation amplitude (OMA) is the difference between two optical power levels of a digital signal generated by an optical source, e.g., the laser diode. OMA is $P_1-P_0$, where $P_1$ is the optical power level generated when the light source is transmitting a logic one, and $P_0$ is the power level when the light source is transmitting a logic zero.

One implementation of a closed-loop OMA controller involves a laser monitor photodiode (MPD), as described in U.S. Pat. No. 9,300,405. The MPD is conventionally co-packaged with the transmission laser diode and senses a proportion of its light output, generating current $I_{MPD}$ in response. For economy and performance, different laser package configurations may provide an independent connection to only one terminal of the MPD, which may be the anode terminal in some cases and the cathode terminal in other cases. Therefore, the $I_{MPD}$ signal provided for a controller circuit may be of either polarity (sink or source). A configurable OMA control circuit (sink or source $I_{MPD}$) would provide compatibility with both types of laser package configurations. However, the different configurations must be implemented without introducing error into the control system.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Figure 1:
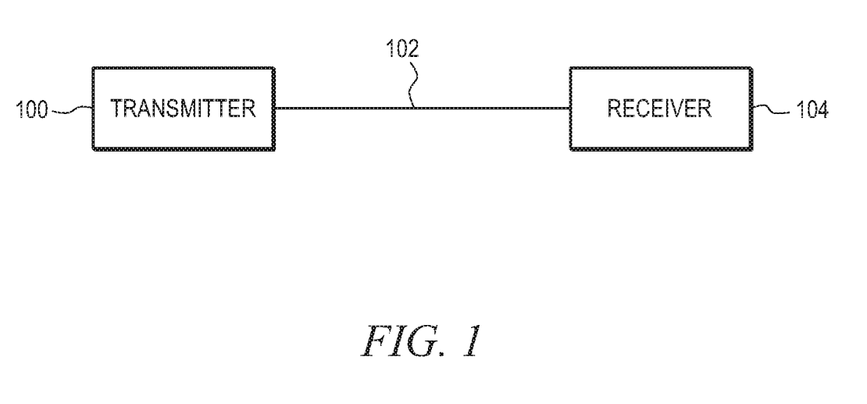
FIG. 1 illustrates functional blocks for optical data transmission.

FIG. 1 illustrates optical data transmitter 100 transmitting light along fiber optical cable 102 to optical data receiver 104. Optical transmitter 100 uses a laser diode driver circuit to modulate a light-emitting diode (LED), vertical-cavity surface-emitting laser (VCSEL), or laser diode in accordance with the transmitted data to generate the data carrying light signal.

Figure 2:
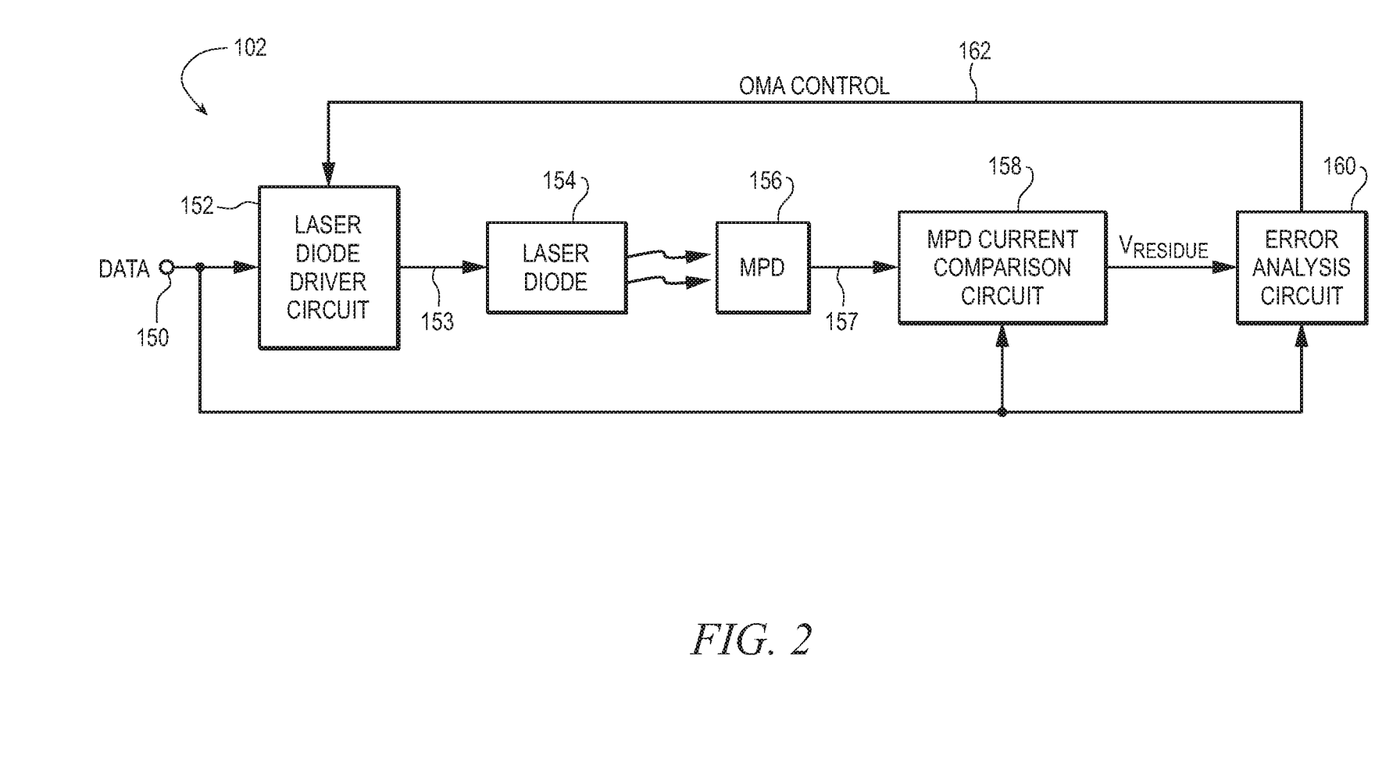
FIG. 2 illustrates further detail of the transmitter portion in the optical data transmission.

FIG. 2 illustrates further detail of optical transmitter 100 with a closed-loop OMA control circuit. Laser diode driver circuit 152 receives one or more input signals to generate the driver signal. For example, laser diode driver circuit 152 may receive a data input signal at terminal 150 that contains the data that is to be modulated into the light signal for transmission, as well as one or more parameter adjustment inputs, such as OMA control input, in order to generate a driver signal at terminal 153. The driver signal causes the data input signal to be modulated onto a light signal from laser diode 154. An optical detector, such as laser monitor photodiode (MPD) 156, detects an amount of light generated by laser diode 154 and outputs a monitoring signal ($I_{MPD}$) at terminal 157. MPD current comparison circuit 158 receives the monitoring signal 157 ($I_{MPD}$) and the data signal 150. MPD current comparison circuit 158 provides a residual error voltage ($V_{RESIDUE}$) to error analysis circuit 160, which generates OMA control feedback signal 162 that is transmitted to laser diode driver circuit 152 to regulate the optical modulation amplitude, as disclosed in U.S. Pat. No. 9,300,405, which is incorporated herein by reference.

As discussed in the background, some laser assemblies provide access to the anode terminal of MPD 156, while other assemblies provide access to the cathode terminal of the MPD. From the perspective of the OMA control circuit, the MPD behaves as a current source in some cases, and a current sink in other cases. It is desirable to make the OMA control circuit configurable to accept either polarity of MPD current, to enable interoperability with both types of laser assembly.

Figure 3:
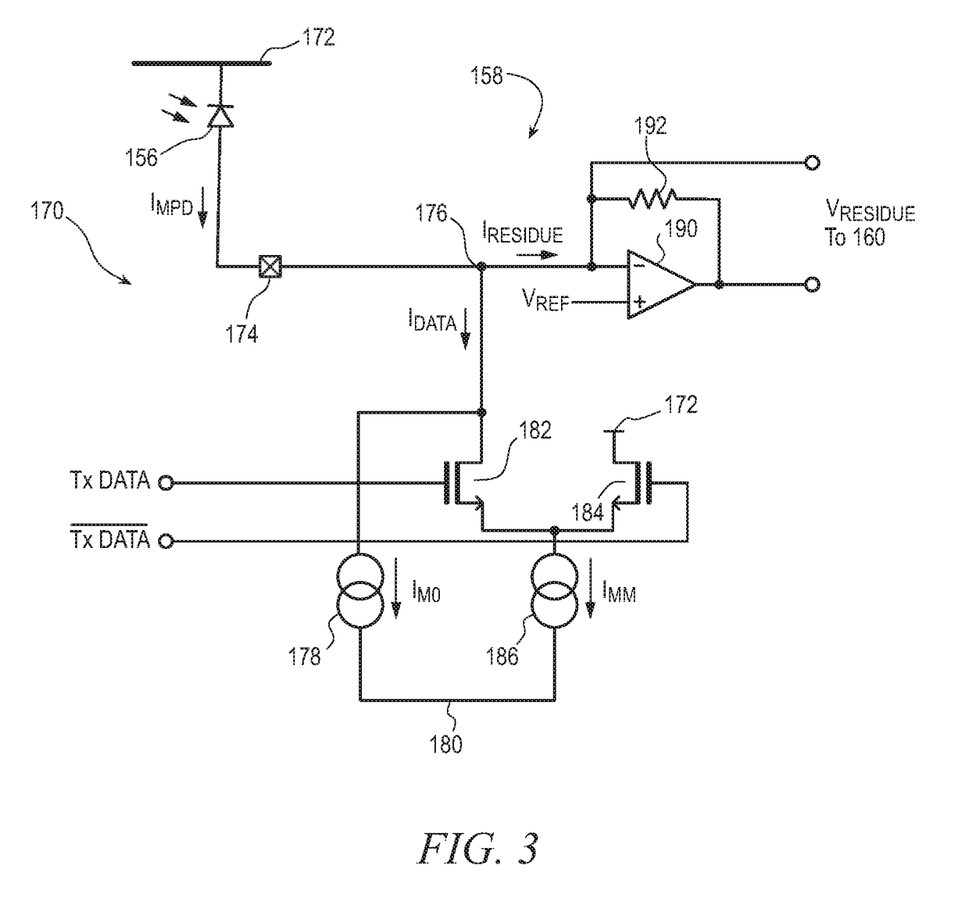
FIG. 3 illustrates a sink mode configuration of the laser MPD current in an OMA control circuit.

FIG. 3 show a first configurable embodiment 170 of MPD current comparison circuit 158 (MPD sink mode) with the cathode of MPD 156 connected to a suitable power source 172. The anode of MPD 156 is connected through MPD terminal 174 to circuit node 176. MPD 156 receives light from laser diode 154, see FIG. 2. Current source 178 is coupled between circuit node 176 and power supply terminal 180 operating at ground potential. The data signal is a differential signal represented as Tx DATA and its complement, tapped from the data signal being conveyed by laser driver circuit 152. Transistor 182 includes a drain coupled to circuit node 176, and a gate coupled to receive Tx DATA. Transistor 184 includes a drain coupled to power supply terminal 172 or suitable dummy load capable of sourcing the required current, and a gate coupled to receive the complement of Tx DATA. The common sources of transistors 182 and 184 are coupled to current source 186, which is referenced to ground terminal 180. Current source 186 is steered into circuit node 176 or away to a dummy load in response to Tx DATA and the complement of Tx DATA switching transistors 182 and 184. A first inverting input of amplifier 190 is coupled to circuit node 176, and a second non-inverting input of amplifier 190 is coupled to a reference voltage $V_{REF}$, e.g., 1-2 VDC. Resistor 192 is coupled between an output of amplifier 190 and the inverting input of the amplifier, forming a transimpedance amplifier. The $V_{RESIDUE}$ output voltage taken across resistor 192 is routed to error analysis circuit 160.

In FIG. 3, the current $I_{MPD}$ is balanced against the data signal represented as a current waveform corresponding to the desired MPD current. Current source 178 provides fixed current $I_{M0}$ corresponding to the expected or ideal value of $I_{MPD}$ with a logic zero output from laser diode 154. Current $I_{M1}$ corresponds to the expected or ideal value of $I_{MPD}$ with a logic one output from laser diode 154. Current source 186 provides fixed current $I_{MM}$. When the complement of Tx DATA is logic high, transistor 182 is non-conductive, and transistor 184 conducts current $I_{MM}$, so $I_{DATA}=I_{M0}$. When Tx DATA is logic high, transistor 184 is non-conductive, and transistor 182 conducts current $I_{MM}$, so $I_{DATA}=I_{M0}+I_{MM}$. $I_{DATA}$ modulates between $I_{M0}$ (logic zero from 154) and $I_{M1}=I_{M0}+I_{MM}$ (logic one from 154), corresponding to Tx DATA, with current $I_{MM}$ being the additional current over $I_{M0}$ required for a logic one output from laser diode 154. The arrangement transistors 182 and 184 and current source 186 is exemplary of circuitry to switch on and off the $I_{MM}$ component of $I_{DATA}$ that is summed at node 176.

With a logic zero output from laser diode 154, the expected or ideal value of $I_{MPD}$ is $I_{DATA}=I_{M0}$. With a logic one output from laser diode 154, the expected or ideal value of $I_{MPD}$ is $I_{DATA}=I_{M0}+I_{MM}$. Given the circuit arrangement, $I_{RESIDUE}=I_{MPD}-I_{DATA}$. If $I_{MPD}=I_{DATA}$ for a given logic state, then $I_{RESIDUE}=0$. The closed-loop OMA control circuit would be in equilibrium.

If the closed-loop OMA control circuit is not in equilibrium, due to changes in temperature, variation in transmitter characteristics over time, or variation in other circuit parameters, then the actual $I_{MPD}$ is not equal to $I_{DATA}$ for a given logic state. Current $I_{RESIDUE}=I_{MPD}-I_{DATA}$ becomes a non-zero error current into TIA 190 and 192 and produces a non-zero error voltage at terminal 158 to OMA control circuit 160.

Figure 4:
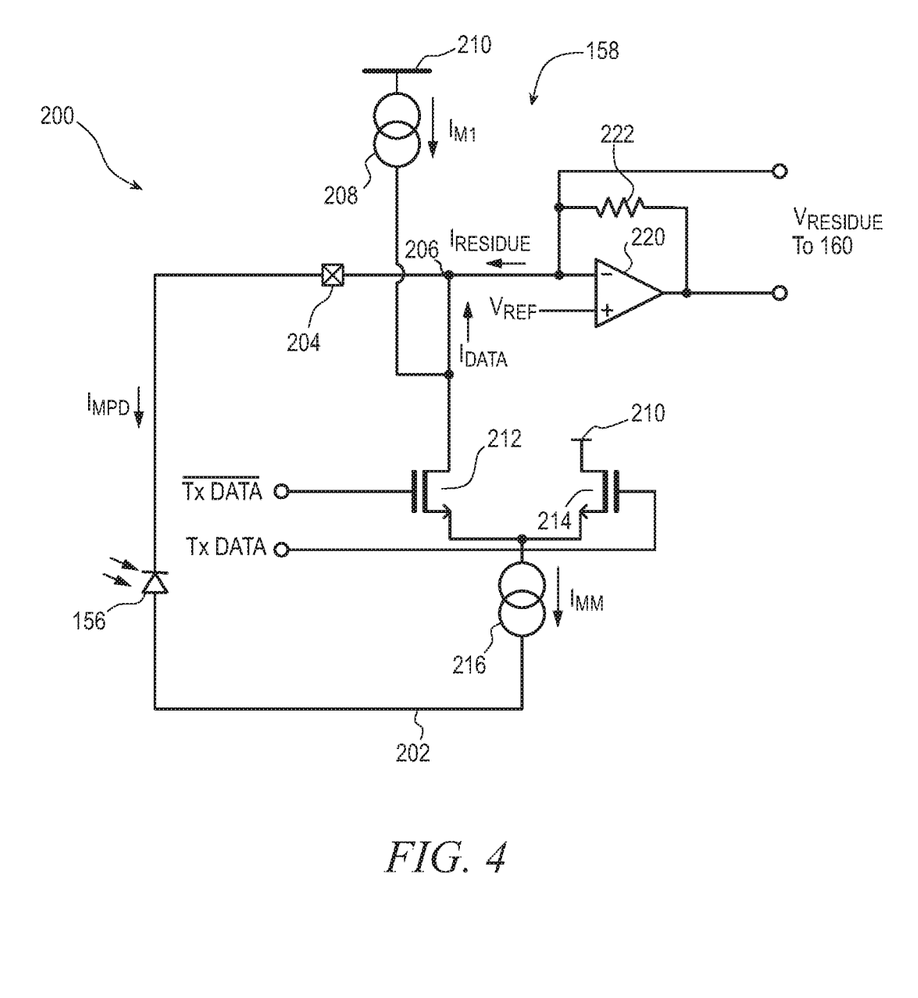
FIG. 4 illustrates a source mode configuration of the laser MPD current in an OMA control circuit.

FIG. 4 shows a second configurable embodiment 200 of MPD current comparison circuit 158 (MPD source mode) with the anode of MPD 156 connected to power supply terminal 202 operating at ground potential. The cathode of MPD 156 is connected through MPD terminal 204 to circuit node 206. MPD 156 receives light from laser diode 154, see FIG. 2. Current source 208 is coupled between a suitable power supply source and circuit node 206. The data signal is a differential signal represented as Tx DATA and its complement tapped from the data signal being conveyed by laser driver circuit 152. Transistor 212 includes a drain coupled to circuit node 206, and a gate coupled to receive the complement of Tx DATA. Transistor 214 includes a drain coupled to power supply terminal 210, and a gate coupled to receive Tx DATA. The common sources of transistors 212 and 214 are coupled to current source 216, which is referenced to ground terminal 202. Current source 216 is steered into circuit node 206 or away to dummy load in response to Tx DATA and the complement of Tx DATA switching transistors 212 and 214. A first inverting input of amplifier 220 is coupled to circuit node 206, and a second non-inverting input of amplifier 220 is coupled to a reference voltage $V_{REF}$, e.g., 1-2 VDC. Resistor 222 is coupled between an output of amplifier 220 and the inverting input of the amplifier, forming a transimpedance amplifier. The $V_{RESIDUE}$ output voltage taken across resistor 222 is routed to error analysis circuit 160.

In FIG. 4, the current $I_{MPD}$ is balanced against the data signal represented as a current waveform corresponding to the desired MPD current. Current source 208 provides fixed current $I_{M1}$ corresponding to the expected or ideal value of $I_{MPD}$ with a logic one output from laser diode 154. Current $I_{M0}$ corresponds to the expected or ideal value of $I_{MPD}$ with a logic zero output from laser diode 154. Current source 216 (similar to 186) provides fixed current $I_{MM}$. When Tx DATA is logic high, transistor 212 (similar to 182) is non-conductive, and transistor 214 (similar to 184) conducts current $I_{MM}$, so $I_{DATA}=I_{M1}$. Note the polarity of $I_{DATA}$ is inverted from FIG. 3. When the complement of Tx DATA is logic high, transistor 214 is non-conductive, and transistor 212 conducts current $I_{MM}$, so $I_{DATA}=I_{M1}-I_{MM}$. $I_{DATA}$ modulates between $I_{M0}=I_{M1}-I_{MM}$ (logic zero from 154) and $I_{M1}$ (logic one from 154), corresponding to Tx DATA, with current $I_{MM}$ being the current subtracted from $I_{M1}$ required for a logic zero output from laser diode 154. The arrangement transistors 212 and 214 and current source 216 is exemplary of circuitry to switch on and off the $I_{MM}$ component of $I_{DATA}$ that is summed at node 206.

With a logic zero output from laser diode 154, the expected or ideal value of $I_{MPD}$ is $I_{DATA}=I_{M1}-I_{MM}$. With a logic one output from laser diode 154, the expected or ideal value of $I_{MPD}$ is $I_{DATA}=I_{M1}$. If $I_{MPD}=I_{DATA}$ for a given logic state, then $I_{RESIDUE}=0$. The closed-loop OMA control circuit would be in equilibrium.

If the closed-loop OMA control circuit is not in equilibrium, due to changes in temperature, variation in transmitter characteristics over time, or variation in other circuit parameters, then the actual $I_{MPD}$ is not equal to $I_{DATA}$ for a given logic state. Current $I_{RESIDUE}$ becomes a non-zero error current from TIA 220 (similar to 190 and 192) and produces a non-zero error voltage at terminal 158 to OMA control circuit 160.

Figure 5:
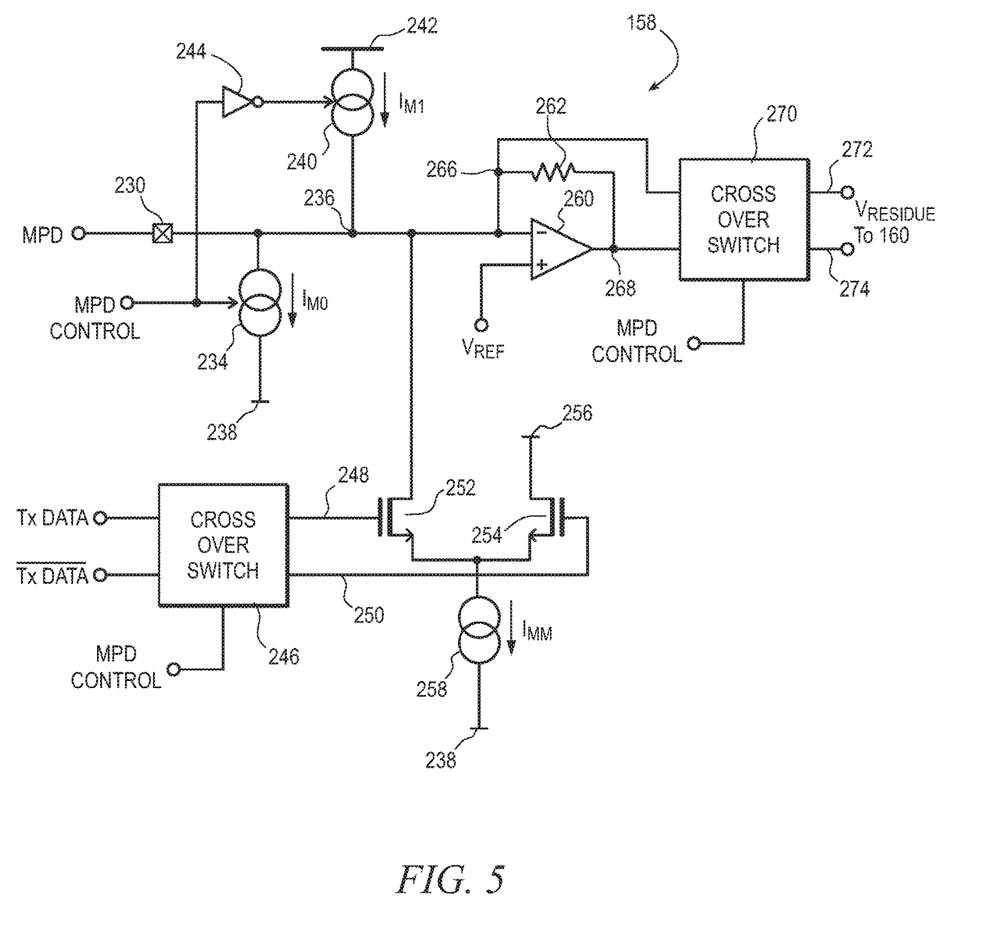
FIG. 5 illustrates the MPD current comparison circuit configurable for either sink mode or source mode.

FIG. 5 illustrates MPD current comparison circuit 158 implemented in one configurable semiconductor package according to application requirements. MPD current comparison circuit 158 provides a single implementation to operate in either sink mode for $I_{MPD}$ as in FIG. 3 or source mode for $I_{MPD}$ as in FIG. 4. MPD 156 connects to MPD terminal 230, see FIGS. 3-4. Current source 234 is coupled between circuit node 236 and power supply terminal 238 and provides current $I_{M0}$ when enabled. Current source 240 is coupled between circuit node 236 and power supply terminal 242 and provides current $I_{M1}$ when enabled. Configuration control signal MPD CONTROL is coupled to an enable input of current source 234 and through inverter 244 to an enable input of current source 240. A first logic state of MPD CONTROL enables current source 234 and disables current source 240 by inverter 244. A second logic state of MPD CONTROL disables current source 234 and enables current source 240 by inverter 244. Current sources 234 and 240 are enabled according to configuration 170 or 200 of MPD current comparison circuit 158, as described in FIGS. 3-4. Accordingly, current source 234 is configurable to operate in a sink mode, and current source 240 is configurable to operate in a source mode, which is opposite sink mode.

The data signal is a differential signal represented as Tx DATA and its complement, tapped from the data signal being conveyed by laser driver circuit 152. Tx DATA and the complement of Tx DATA are routed through cross over switch 246. A first logic state of MPD CONTROL routes Tx DATA to node 248 and the complement of Tx DATA to node 250. A second logic state of MPD CONTROL routes Tx DATA to node 250 and the complement of Tx DATA to node 248. Cross over switch 246 provides the necessary polarity swapping to select between the two modes under the control of MPD CONTROL. Transistor 252 includes a drain coupled to circuit node 236, and a gate coupled to node 248. Transistor 254 includes a drain coupled to power supply terminal 256, and a gate coupled to node 250. The common sources of transistors 252 and 254 are coupled to current source 258, which is referenced to ground terminal 238 and provides current $I_{MM}$. A first inverting input of amplifier 260 is coupled to circuit node 236, and a second non-inverting input of amplifier 260 is coupled to a reference voltage $V_{REF}$. Resistor 262 is coupled between an output of amplifier 260 and the inverting input of the amplifier, forming a transimpedance amplifier. Terminals 266 and 268 of resistor 262 are coupled to cross over switch 270. A first logic state of MPD CONTROL routes terminal 266 to terminal 272 and terminal 268 to terminal 274. A second logic state of MPD CONTROL routes terminal 266 to terminal 274 and terminal 268 to terminal 272. Terminals 272 and 274 of cross over switch 270 are connected to OMA control circuit 160. Cross over switch 270 provides the necessary polarity swapping to select between the two modes under the control of MPD CONTROL. Depending on the configuration set by MPD CONTROL, MPD current comparison circuit 158 in FIG. 5 operates as described for configuration 170 (sink mode) or configuration 200 (source mode).

In summary, MPD current comparison circuit 158 allows MPD 156 to behave as a current source in some cases, and a current sink in other cases. It is desirable to make the OMA control circuit configurable to accept either polarity of MPD current, to enable interoperability with both types of laser assembly.

While one or more embodiments of the present invention have been illustrated in detail, the skilled artisan will appreciate that modifications and adaptations to those embodiments may be made without departing from the scope of the present invention as set forth in the following claims.

What is claimed:

1. A photodiode current comparison circuit, comprising:
    a first current source coupled to a circuit node and configurable to operate in a first mode;
    a second current source coupled to the circuit node and configurable to operate in a second mode opposite the first mode;
    a third current source switchable to route a current to the circuit node in response to a data signal;
    a cross-over circuit comprising inputs coupled for receiving the data signal and outputs for switching polarity of the data signal; and
    a photodiode coupled to the circuit node.

2. The photodiode current comparison circuit of claim 1, wherein an anode of the photodiode is coupled to the circuit node and a cathode of the photodiode is coupled to a power supply terminal.

3. The photodiode current comparison circuit of claim 1, wherein a cathode of the photodiode is coupled to the circuit node and an anode of the photodiode is coupled to a power supply terminal.

4. The photodiode current comparison circuit of claim 1, further including an amplifier including a first input coupled to the circuit node, a second input coupled for receiving a reference signal, and an output providing an error signal of the photodiode.

5. A photodiode current comparison circuit, comprising:
    a first current source coupled to a circuit node and configurable to operate in a first mode;
    a second current source coupled to the circuit node and configurable to operate in a second mode opposite the first mode;
    a third current source switchable to route a current to the circuit node in response to a data signal and a complementary data signal;
    a first transistor including a first conduction terminal coupled to the circuit node, a second conduction terminal coupled to the third current source, and a control terminal coupled for receiving the data signal;
    a second transistor including a first conduction terminal coupled to a first power supply terminal, a second conduction terminal coupled to the third current source, and a control terminal coupled for receiving the complementary data signal; and
    a photodiode coupled to the circuit node.

6. The photodiode current comparison circuit of claim 5, wherein an anode of the photodiode is coupled to the circuit node and a cathode of the photodiode is coupled to the first power supply terminal.

7. The photodiode current comparison circuit of claim 5, wherein a cathode of the photodiode is coupled to the circuit node and an anode of the photodiode is coupled to a second power supply terminal.

8. The photodiode current comparison circuit of claim 5, further including an amplifier including a first input coupled to the circuit node, a second input coupled for receiving a reference signal, and an output providing an error signal of the photodiode.

9. A photodiode current comparison circuit in a semiconductor package, comprising:
    a first current source coupled to a circuit node;
    a second current source coupled to the circuit node;
    a control circuit for enabling the first current source or second current source;
    a third current source switchable to route a current to the circuit node in response to a data signal;
    a cross-over circuit comprising inputs coupled for receiving the data signal and outputs for switching polarity of the data signal; and
    a photodiode coupled to the circuit node.

10. The photodiode current comparison circuit of claim 9, wherein an anode of the photodiode is coupled to the circuit node and a cathode of the photodiode is coupled to a power supply terminal.

11. The photodiode current comparison circuit of claim 9, wherein a cathode of the photodiode is coupled to the circuit node and an anode of the photodiode is coupled to a power supply terminal.

12. The photodiode current comparison circuit of claim 9, further including an amplifier including a first input coupled to the circuit node, a second input coupled for receiving a reference signal, and an output providing an error signal of the photodiode.

13. The photodiode current comparison circuit of claim 9, wherein the first current source is referenced to a first power supply potential and the second current source is referenced to a second power supply potential.

14. A photodiode current comparison circuit in a semiconductor package, comprising:
    a first current source coupled to a circuit node;
    a second current source coupled to the circuit node;
    a control circuit for enabling the first current source or second current source;

a third current source switchable to route a current to the circuit node in response to a data signal;

a first transistor including a first conduction terminal coupled to the circuit node, a second conduction terminal coupled to the third current source, and a control terminal coupled for receiving the data signal;

a second transistor including a first conduction terminal coupled to a first power supply terminal, a second conduction terminal coupled to the third current source, and a control terminal coupled for receiving the data signal; and a photodiode coupled to the circuit node.

15. The photodiode current comparison circuit of claim 14, wherein an anode of the photodiode is coupled to the circuit node and a cathode of the photodiode is coupled to the first power supply terminal.

16. The photodiode current comparison circuit of claim 14, wherein a cathode of the photodiode is coupled to the circuit node and an anode of the photodiode is coupled to a second power supply terminal.

17. The photodiode current comparison circuit of claim 14, further including an amplifier including a first input coupled to the circuit node, a second input coupled for receiving a reference signal, and an output providing an error signal of the photodiode.

18. The photodiode current comparison circuit of claim 14, wherein the first current source is referenced to a first power supply potential and the second current source is referenced to a second power supply potential.

19. A method of making a photodiode current comparison circuit, comprising:

providing a first current source coupled to a circuit node;

providing a second current source coupled to the circuit node;

providing a control circuit for enabling the first current source or second current source;

providing a third current source switchable to route a current to the circuit node in response to a data signal;

providing a first transistor including a first conduction terminal coupled to the circuit node, a second conduction terminal coupled to the third current source, and a control terminal coupled for receiving the data signal;

providing a second transistor including a first conduction terminal coupled to a first power supply terminal, a second conduction terminal coupled to the third current source, and a control terminal coupled for receiving the data signal; and providing a photodiode coupled to the circuit node.

20. The method of claim 19, wherein an anode of the photodiode is coupled to the circuit node and a cathode of the photodiode is coupled to the first power supply terminal.

21. The method of claim 19, wherein a cathode of the photodiode is coupled to the circuit node and an anode of the photodiode is coupled to a second power supply terminal.

22. The method of claim 19, further including providing an amplifier including a first input coupled to the circuit node, a second input coupled for receiving a reference signal, and an output providing an error signal of the photodiode.

23. The method of claim 19, further including providing a cross-over circuit comprising inputs coupled for receiving the data signal and outputs for switching polarity of the data signal.

24. The method of claim 19, wherein the first current source is referenced to a first power supply potential and the second current source is referenced to a second power supply potential.

* * * * *